United States Patent
Tachi

(10) Patent No.: US 10,109,295 B2
(45) Date of Patent: Oct. 23, 2018

(54) AUDIO PROCESSING APPARATUS AND AUDIO PROCESSING METHOD

(71) Applicant: Alpine Electronics, Inc., Shinagawa-ku, Tokyo (JP)

(72) Inventor: Ryosuke Tachi, Iwaki (JP)

(73) Assignee: Alpine Electronics, Inc., Tokyo (JP)

( * ) Notice: Subject to any disclaimer, the term of this patent is extended or adjusted under 35 U.S.C. 154(b) by 0 days.

(21) Appl. No.: 15/468,572

(22) Filed: Mar. 24, 2017

(65) Prior Publication Data

US 2017/0345442 A1 Nov. 30, 2017

(30) Foreign Application Priority Data

May 26, 2016 (JP) .................................. 2016-105691

(51) Int. Cl.
*G10L 19/14* (2006.01)
*G10L 21/038* (2013.01)

(52) U.S. Cl.
CPC .................................. *G10L 21/038* (2013.01)

(58) Field of Classification Search
USPC .................. 704/200–230, 500–504
See application file for complete search history.

(56) References Cited

U.S. PATENT DOCUMENTS

| 6,680,972 B1 * | 1/2004 | Liljeryd ............... G10L 21/038 375/240 |
| 8,024,197 B2 | 9/2011 | Saito |
| 2009/0240508 A1 | 9/2009 | Saito |
| 2010/0014576 A1 | 1/2010 | Komamura |

FOREIGN PATENT DOCUMENTS

| EP | 2209116 A1 | 7/2010 |
| JP | 2005-084370 | 3/2005 |
| JP | 2006-119524 | 5/2006 |
| JP | 2006119524 A | 5/2006 |
| JP | 2006-330144 | 12/2006 |
| JP | 2009-229492 | 10/2009 |

OTHER PUBLICATIONS

European Search Report in European Application No. 17172658 dated Jul. 7, 2017.

* cited by examiner

*Primary Examiner* — Huyen Vo
(74) *Attorney, Agent, or Firm* — Brinks Gilson & Lione

(57) ABSTRACT

An upper limit of a frequency range of audio indicated by input audio data is detected. A representative point extraction unit downsamples the input audio data to a sampling rate set to be less than or equal to twice the detected upper limit to obtain representative-point audio data. An interpolation processing unit upsamples the representative-point audio data by using a fractal interpolation function (FIF) that uses a mapping function calculated by a mapping function calculation unit, while using the input audio data, if necessary, to generate high-frequency interpolated audio data.

6 Claims, 5 Drawing Sheets

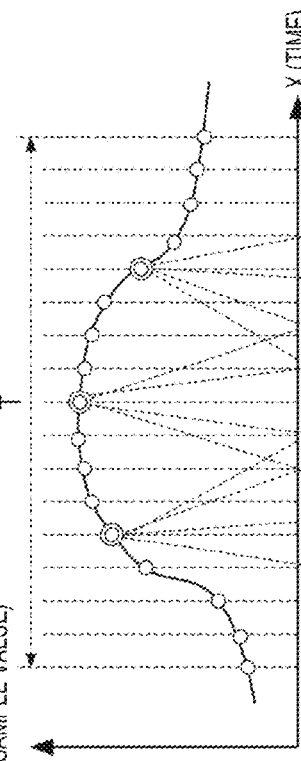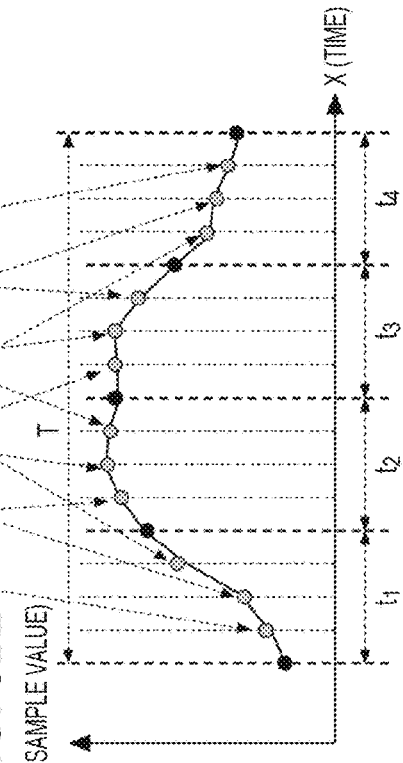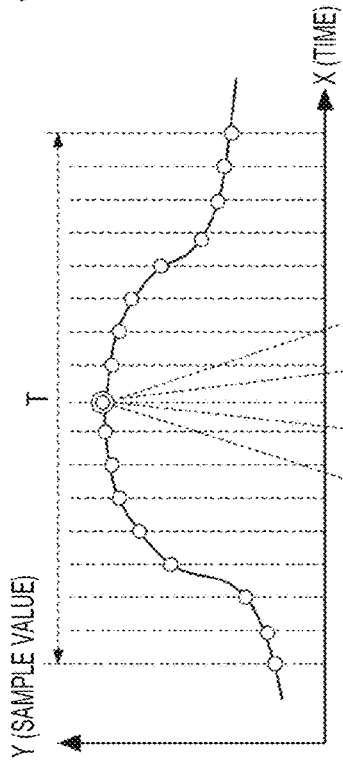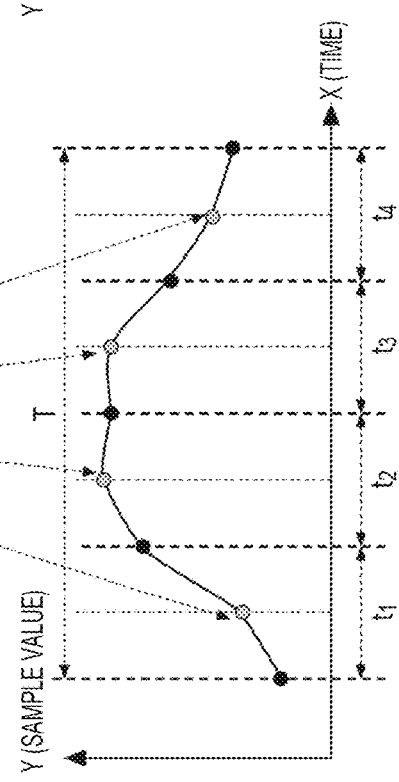

AUDIO PROCESSING APPARATUS AND AUDIO PROCESSING METHOD

RELATED APPLICATIONS

The present application claims priority to Japanese Patent Appln. No. 2016-105691, filed May 26, 2016, the entire disclosure of which is hereby incorporated by reference.

BACKGROUND

1. Field of the Disclosure

The present invention relates to a technique for interpolating high-frequency components of audio.

2. Description of the Related Art

There are known techniques for interpolating high-frequency components of audio, examples of which include techniques using fractal interpolation functions (FIFs) (for example, Japanese Unexamined Patent Application Publication Nos. 2005-084370, 2006-330144, and 2009-229492).

An FIF is used in a technique for, as illustrated in FIG. 6, interpolating a contraction mapping $\omega i(S)$ of a signal S for a time interval T of audio data, as a signal for an interpolation interval ti that is one of a plurality of time segments into which the time interval T is divided at a time position Xi for samples located at predetermined intervals as a division point, to upsample the audio data to interpolate high-frequency components of audio.

A known technique for upsampling audio data by using FIFs to interpolate high-frequency components of audio is a technique for, when the upper limit of the frequency range of audio indicated by input audio data is less than one half of the sampling rate of the audio data, downsampling the audio data to reduce the sampling rate of the audio data to one half, and then, upsampling the downsampled audio data using an FIF to interpolate high-frequency components of audio (Japanese Unexamined Patent Application Publication No. 2006-119524).

The upper limit of the frequency range of audio indicated by audio data having a sampling rate Fs is equal to Fs/2 according to Nyquist's theorem. For some audio data, such as audio data provided in compressed and encoded form, however, the upper limit of the frequency range of audio indicated by the audio data, which has a sampling rate Fs, is often less than Fs/2.

Even when the technique described above for downsampling input audio data to reduce the sampling rate of the input audio data to one half and then performing upsampling by using an FIF to interpolate high-frequency components of audio is applied, if an upper limit Fmax of the frequency range of audio indicated by the input audio data is less than one half of a sampling rate Fs of the downsampled audio data, the downsampled audio data does not include frequency components between the upper limit Fmax and the value Fs/2. Thus, a phenomenon occurs that, as illustrated in FIG. 7A, high-frequency components around the upper limit Fmax of the frequency range of the audio indicated by the audio data are lost without being interpolated.

FIG. 7A illustrates a case where audio data has a sampling rate of 96 kHz, the upper limit of the frequency range of audio indicated by the audio data is 20 kHz, downsampled audio data has a sampling rate of 48 kHz, and audio data upsampled by using an FIF has a sampling rate of 96 kHz. In FIG. 7A, SI represents a frequency characteristic of audio data and SO represents a frequency characteristic of audio data whose high-frequency components have been interpolated by using an FIF.

SUMMARY

It is an object of the present invention to provide an audio processing apparatus capable of interpolating high-frequency components of audio data, as desired, regardless of the upper limit of the frequency range of audio indicated by the audio data.

One aspect of the present disclosure provides an audio processing apparatus for performing high-frequency interpolation of audio data. The audio processing apparatus includes a frequency range upper-limit detector configured to detect an upper limit of a frequency range of audio indicated by input audio data that is audio data to be subjected to the high-frequency interpolation, a downsampler configured to downsample the input audio data by decimating samples from the input audio data so as to achieve a sampling rate that is less than or equal to twice the upper limit detected by the frequency range upper-limit detector to generate intermediate audio data, and an upsampler configured to upsample the intermediate audio data generated by the downsampler using a fractal interpolation function to generate high-frequency interpolated audio data.

The audio processing apparatus may be configured such that the downsampler is configured to downsample the input audio data to a maximum sampling rate equal to the sampling rate that is less than or equal to twice the upper limit detected by the frequency range upper-limit detector among sampling rates that are reciprocals of powers of 2 of the sampling rate of the input audio data, by decimating samples from the input audio data, to generate intermediate audio data and the upsampler upsamples the intermediate audio data to a sampling rate that is a multiple of a power of 2 of a sampling rate of the intermediate audio data by using a fractal interpolation function to generate the high-frequency interpolated audio data.

The audio processing apparatus may further be configured such that, when the input audio data is audio data obtained by decoding compressed and encoded audio data, the frequency range upper-limit detector is configured to detect the upper limit of the frequency range of the audio indicated by the input audio data on the basis of a bit rate indicating the number of bits of the compressed and encoded audio data to be processed per unit time when the compressed and encoded audio data is reproduced.

The audio processing apparatus described above may prevent or reduce the occurrence of components in a frequency range which are lost without being interpolated by performing upsampling using a fractal interpolation function (FIF) even if the upper limit of the frequency range of audio indicated by audio data is low, thereby performing high-frequency interpolation as desired.

As described above, an aspect of the present disclosure may provide an audio processing apparatus capable of interpolating high-frequency components of audio data, as desired, regardless of the upper limit of the frequency range of audio indicated by the audio data.

BRIEF DESCRIPTION OF THE DRAWINGS

FIGS. 5A1 and 5A2 illustrate an example of the high-frequency interpolation operation;

FIGS. 5B1 and 5B2 illustrate an example of the high-frequency interpolation operation;

DETAILED DESCRIPTION OF THE DRAWINGS

Figure 1:
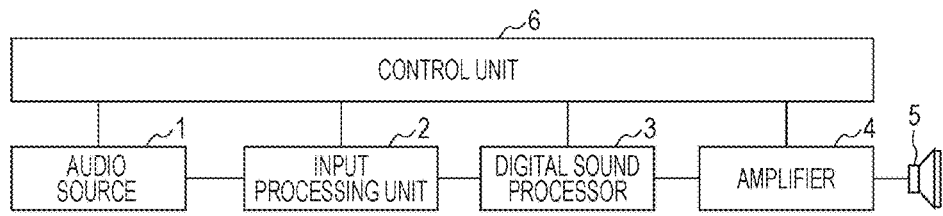
FIG. 1 is a block diagram illustrating a configuration of an audio processing apparatus.

FIG. 1 illustrates a configuration of an audio processing apparatus.

As illustrated in FIG. 1, the audio processing apparatus includes an audio source 1, an input processing unit 2, a digital sound processor 3, an amplifier 4, a speaker 5, and a control unit 6 that controls the audio source 1, the input processing unit 2, the digital sound processor 3, and the amplifier 4. In the configuration described above, the audio source 1 is a device that outputs audio data, such as a recording medium having audio files recorded thereon or a broadcast receiver that receives audio data.

The input processing unit 2 captures audio data from the audio source 1 in accordance with control of the control unit 6, performs pre-processing such as decoding the captured audio data, if necessary, and outputs the audio data subjected to the pre-processing to the digital sound processor 3 as input audio data.

Further, prior to the output of the input audio data to the digital sound processor 3, the input processing unit 2 detects the sampling rate of the input audio data and the upper limit of the frequency range of audio indicated by the input audio data, and notifies the control unit 6 of the detected input sampling rate and upper limit. The upper limit of the frequency range of the audio indicated by the audio data may be detected by analyzing the frequency spectra of the input audio data. Alternatively, if the audio data captured from the audio source 1 is compressed and encoded audio data, the upper limit of the frequency range of the audio indicated by the input audio data may be detected in accordance with the bit rate of the compressed and encoded audio data (the number of bits of the compressed and encoded audio data to be processed per second when reproduced). In a case where the upper limit of the frequency range of the audio indicated by the input audio data is detected in accordance with the bit rate of the compressed and encoded audio data, the relationship between the bit rate of audio data and the upper limit of the frequency range of audio indicated by the audio data is registered in advance and the upper limit of the frequency range of audio indicated by input audio data is detected in accordance with the registered relationship.

The digital sound processor 3 is a processor that performs audio processing in accordance with a preset program. The digital sound processor 3 performs audio processing, such as high-frequency interpolation, on the input audio data input from the input processing unit 2 in accordance with control of the control unit 6, and outputs the resulting audio data to the amplifier 4 as output audio data.

The amplifier 4 amplifies the output audio data input from the digital sound processor 3 with a gain set by the control unit 6, and outputs the resulting audio data to the speaker 5.

Figure 2:
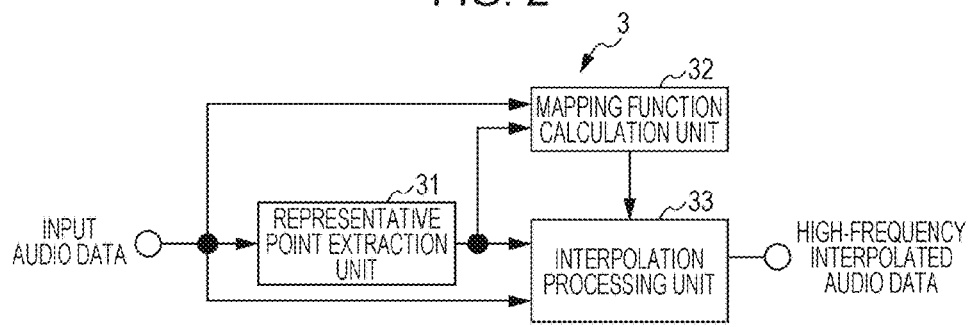
FIG. 2 illustrates functional blocks in the audio processing apparatus for performing high-frequency interpolation.

FIG. 2 illustrates a configuration of functions of the digital sound processor 3 for performing high-frequency interpolation.

As illustrated in FIG. 2, the digital sound processor 3 includes a representative point extraction unit 31, a mapping function calculation unit 32, and an interpolation processing unit 33. The operation of the representative point extraction unit 31, the mapping function calculation unit 32, and the interpolation processing unit 33 will be described below.

The representative point extraction unit 31, the mapping function calculation unit 32, and the interpolation processing unit 33 of the digital sound processor 3 are implemented by, as described above, the digital sound processor 3 executing a preset program.

The control unit 6 is a processor that performs processes in accordance with preset programs, and performs a high-frequency interpolation operation control process as one of the processes in accordance with the preset programs.

Figure 3:
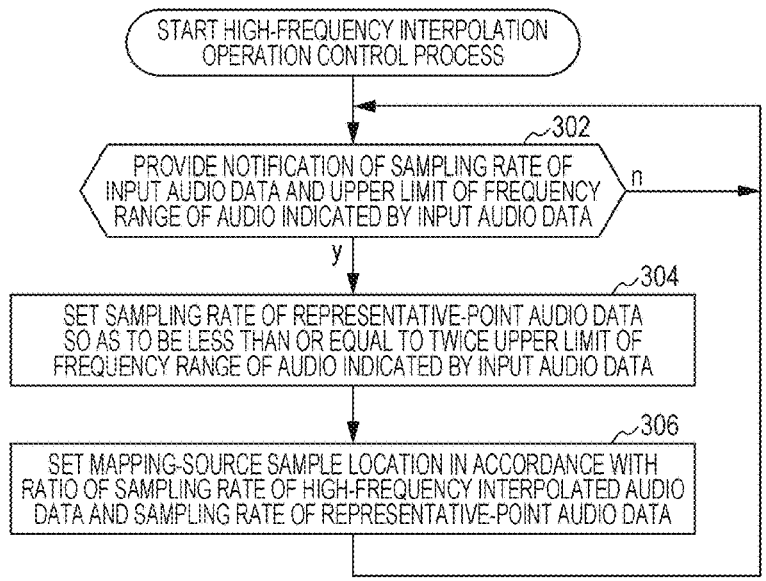
FIG. 3 is a flowchart illustrating a high-frequency interpolation operation control process.

FIG. 3 illustrates the procedure of the high-frequency interpolation operation control process.

In the high-frequency interpolation operation control process, as illustrated in FIG. 3, the control unit 6 monitors the input processing unit 2 to determine whether the input processing unit 2 has provided a notification of the sampling rate of the input audio data and the upper limit of the frequency range of audio indicated by the input audio data (step 302).

When the notification is provided, the control unit 6 determines the sampling rate of representative-point audio data so that the sampling rate of the representative-point audio data is less than or equal to twice the upper limit of the frequency range of the audio indicated by the input audio data, and sets the determined sampling rate of the representative-point audio data in the representative point extraction unit 31 (step 304).

The sampling rate of the representative-point audio data is assumed to be, for example, a maximum sampling rate that is less than or equal to twice the upper limit of the frequency range of the audio indicated by the input audio data from the input processing unit 2 among sampling rates that are reciprocals of powers of 2 of the sampling rate of the input audio data.

The representative point extraction unit 31 in which the sampling rate of the representative-point audio data has been set in the way described above downsamples, for each unit processing interval T that is a time interval having a predetermined time length, the input audio data to audio data having a sampling rate set as the sampling rate of the representative-point audio data. The representative point extraction unit 31 outputs the downsampled audio data to the mapping function calculation unit 32 and the interpolation processing unit 33 as representative-point audio data for the unit processing interval T.

The downsampling of the input audio data to the representative-point audio data is performed by selecting a sample as a representative point from among samples within the unit processing interval T of the input audio data so that the sampling rate of the representative point is equal to the set sampling rate of the representative-point audio data and by using, as representative-point audio data within the unit processing interval T, audio data obtained by decimating samples other than the sample selected as the representative point from the input audio data.

Figure 4A:
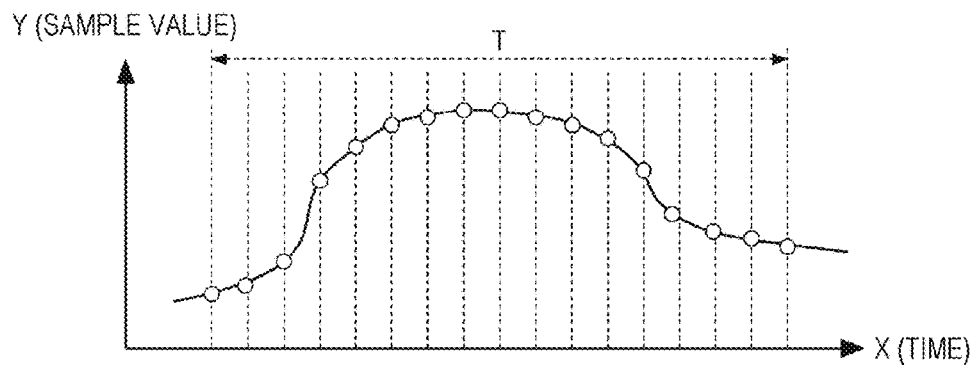
FIGS. 4A to 4C illustrate examples of a high-frequency interpolation operation.
Figure 4B:
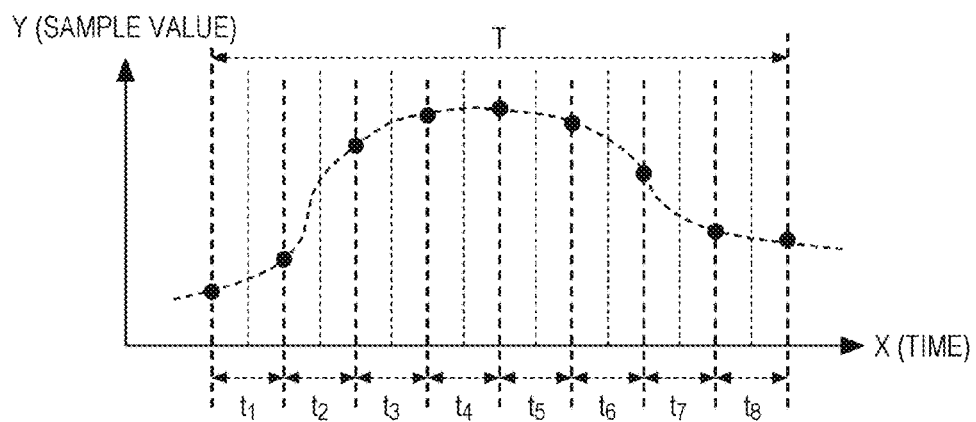

That is, for example, a sampling rate that is one half of the sampling rate of the input audio data is set as the sampling rate of the representative-point audio data. In this case, every second sample is extracted as a representative point from samples indicated by white circles in FIG. 4A within the unit processing interval T of the input audio data, and, as indicated by black circles in FIG. 4B, samples of the input audio data extracted as representative points are used as samples of representative-point audio data within the unit processing interval T.

Figure 4C:
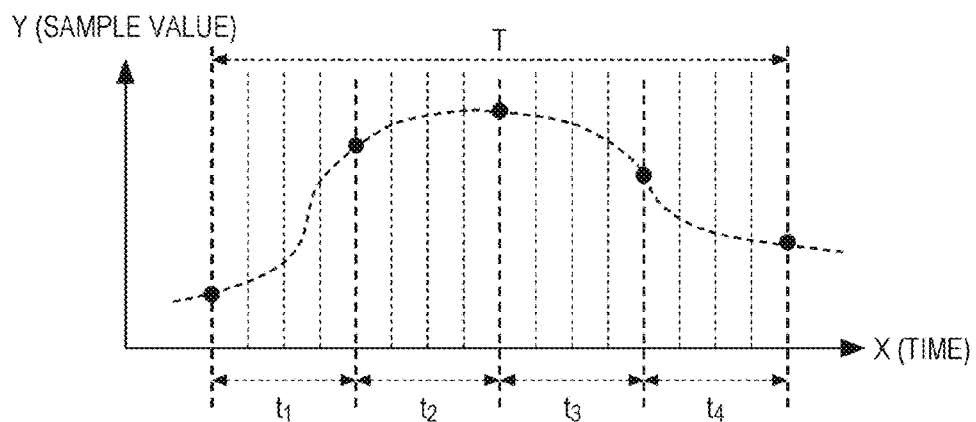
Figure 6:
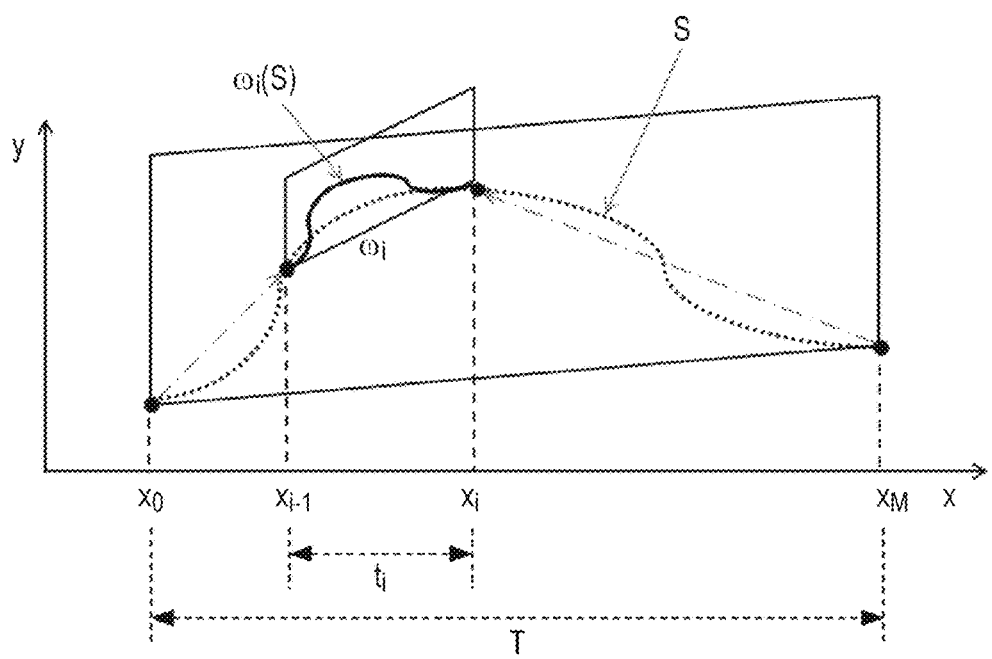
FIG. 6 illustrates the principle of high-frequency interpolation using an FIF.

For another example, a sampling rate that is one-quarter of that of the input audio data is set as the sampling rate of the representative-point audio data. In this case, every fourth sample is extracted as a representative point from samples indicated by white circles in FIG. 4A within the unit processing interval T of the input audio data, and, as indicated by black circles in FIG. 4C, samples of the input audio data extracted as representative points are used as samples of representative-point audio data within the unit processing interval T.

In the following description, an interval $t_i$ between adjacent samples within the unit processing interval T of the representative-point audio data generated in the way described above is referred to as an "interpolation interval".

Upon receipt of the representative-point audio data in the manner described above, the mapping function calculation unit 32 calculates, for each interpolation interval $t_i$ of the unit processing interval T, a mapping function $\omega_i$ that is a contraction mapping of a signal for the unit processing interval T of the input audio data into the interpolation interval $t_i$, as a mapping function $\omega_i$ for the interpolation interval $t_i$ and sets the mapping function $\omega_i$ in the interpolation processing unit 33.

The calculation of a mapping function $\omega_i$ for an interpolation interval $t_i$ is performed in the following way.

When $x_i$ represents a time position of the i-th sample within a unit time interval T of representative-point audio data and $y_i$ represents a sample value (magnitude) of the i-th sample within the unit time interval T, $a_i$, $e_i$, $c_i$, and $f_i$ are defined by Eqs. (1) to (4) below, respectively. In the equations, $x_0$ represents the time position of a sample that is the start point of the unit time interval T of the representative-point audio data, $y_0$ represents the sample value (magnitude) of the sample that is the start point of the unit time interval T, $x_M$ represents the time position of a sample that is the end point of the unit time interval T of the representative-point audio data, and $y_M$ represents the sample value (magnitude) of the sample that is the end point of the unit time interval T.

$$a_i = \frac{x_i - x_{i-1}}{x_M - x_0} \quad \text{Eq. (1)}$$

$$e_i = \frac{x_M x_{i-1} - x_0 x_i}{x_M - x_0} \quad \text{Eq. (2)}$$

$$c_i = \frac{y_i - y_{i-1}}{x_M - x_0} - d_i \frac{y_M - y_0}{x_M - x_0} \quad \text{Eq. (3)}$$

$$f_i = \frac{x_M y_{i-1} - x_0 y_i}{x_M - x_0} - d_i \frac{x_M y_0 - x_0 y_M}{x_M - x_0} \quad \text{Eq. (4)}$$

Note that $d_i$ is selected as the value that minimizes Eq. (5) below, where $\mu_n$ represents the time position of the n-th sample of the input audio data within the unit time interval T, and $v_n$ represents the sample value (magnitude) of the n-th sample of the input audio data within the unit time interval T.

$$E_i = \Sigma_{n=0}^{N}(c_i \cdot u_n + d_i \cdot v_n + f_i - v_m)^2 \quad \text{Eq. (5)}$$

In Eq. (5), m is determined by Eq. (6) below, where D represents the time interval between adjacent samples of the input audio data.

$$m = [a_i \cdot u_n + e_n + 0.5D] \quad \text{Eq. (6)}$$

In Eq. (6), [ ] is the Gaussian sign and [X] represents a maximum integer that does not exceed X.

When $\alpha_n$ and $\beta_n$ are defined by Eqs. (7) and (8), respectively, Eq. (5) can be modified to Eq. (9).

$$\alpha_n = v_n - \frac{y_M - y_0}{x_M - x_0} u_n - \frac{x_M y_0 - x_0 y_M}{x_M - x_0} \quad \text{Eq. (7)}$$

$$\beta_n = v_m - \frac{y_i - y_{i-1}}{x_M - x_0} u_n - \frac{x_M y_{i-1} - x_0 y_i}{x_M - x_0} \quad \text{Eq. (8)}$$

$$E_i = \sum_{n=0}^{N} (\alpha_n \cdot d_i - \beta_n)^2 \quad \text{Eq. (9)}$$

Then, $d_i$ that maximizes Eq. (5) and Eq. (9) can be determined by Eq. (10).

$$d_i = \frac{\sum_{n=0}^{N} \alpha_n \beta_n}{\sum_{n=0}^{N} \alpha_n^2} \quad \text{Eq. (10)}$$

Then, the mapping function $\omega_i$ for the interpolation interval $t_i$ is set by Eq. (11) below by using $a_i$, $e_i$, $c_i$, and $f_i$, which are determined in the way described above.

$$\begin{pmatrix} p_n \\ q_n \end{pmatrix} = \omega_i \begin{pmatrix} u_n \\ v_n \end{pmatrix} = \begin{pmatrix} a_i u_n + e_i \\ c_i u_n + d_i v_n + f_i \end{pmatrix} \quad \text{Eq. (11)}$$

In Eq. (11), $p_n$ represents the time position of the n-th sample of the input audio data within the unit time interval T which has been subjected to mapping using the mapping function $\omega_i$, and $q_n$ represents the sample value (magnitude) of the n-th sample of the input audio data within the unit time interval T which has been subjected to mapping using the mapping function $\omega_i$.

The calculation of the mapping function $\omega_i$ described above may be performed after the duration of each time segment is normalized so that the time length of the unit time interval T is equal to 1, for simplicity of calculation.

Referring back to FIG. 3, when the sampling rate of the representative-point audio data is set in the representative point extraction unit 31 (step 304), the control unit 6 determines, by calculation, a mapping-source sample location in accordance with the ratio of the sampling rate of the high-frequency interpolated audio data and the sampling rate of the representative-point audio data, and sets the mapping-source sample location in the interpolation processing unit 33 (step 306). Then, the process returns to step 302. The sampling rate of the high-frequency interpolated audio data is a sampling rate set in advance as a sampling rate of high-frequency interpolated audio data that is audio data subjected to high-frequency interpolation by the digital sound processor 3.

In some forms of the present disclosure, it is assumed that the sampling rate of the high-frequency interpolated audio data and the sampling rate of the input audio data have a relationship in which the sampling rate of the high-frequency interpolated audio data is equal to the sampling rate of the input audio data or is a multiple of a power of 2 of the sampling rate of the input audio data and that the sampling rate of the high-frequency interpolated audio data is a multiple of a power of 2 of the sampling rate of the representative-point audio data.

The determination of the mapping-source sample location by calculation in step 306 is performed in the following way.

If the sampling rate of the high-frequency interpolated audio data is a multiple of the n-th power of 2 of the sampling rate of the representative-point audio data, a time position that is a position of division when the unit processing interval T is divided into $2^n$ time intervals having an equal time length is determined as a mapping-source sample location by calculation. Note that the start point and end point of the unit processing interval T are not determined as mapping-source sample locations by calculation. However, the end point of the unit processing interval T may be determined as a mapping-source sample location by calculation.

As a result, for example, if the sampling rate of the high-frequency interpolated audio data is twice the sampling rate of the representative-point audio data, as indicated by a double circle in FIG. 5A1 indicating a sample at a mapping-source sample location of the input audio data, the median time position of the unit processing interval T is determined as a mapping-source sample location by calculation. If the sampling rate of the high-frequency interpolated audio data is four times the sampling rate of the representative-point audio data, as indicated by double circles in FIG. 5B1 indicating samples at mapping-source sample locations of the input audio data, a time position that is spaced one-quarter of the time length of the unit processing interval T from the start point of the unit processing interval T, the median time position of the unit processing interval T, and a time position that is spaced one-quarter of the time length of the unit processing interval T from the end point of the unit processing interval T are determined as mapping-source sample locations by calculation.

The interpolation processing unit 33 in which mapping-source sample locations have been set in the way described above maps, for each interpolation interval $t_i$ of the unit processing interval T, a sample at each mapping-source sample location of the input audio data for the unit processing interval T onto between representative points of the representative-point audio data by using a mapping function $\omega_i$ calculated for the interpolation interval $t_i$ by the mapping function calculation unit 32 to upsample the representative-point audio data, and outputs the upsampled audio data as high-frequency interpolated audio data.

Specifically, for example, as in FIG. 5A1, when the median time position of the unit processing interval T is set as a mapping-source sample location, as illustrated in FIG. 5A2, for each interpolation interval $t_i$ of the representative-point audio data, the sample indicated by the double circle at the mapping-source sample location of the input audio data is mapped onto the median time position of the interpolation interval $t_i$ by using a mapping function $\omega_i$ for the interpolation interval $t_i$ to upsample the representative-point audio data, and the upsampled representative-point audio data is output as high-frequency interpolated audio data.

As in FIG. 5B1, when the time position spaced one-quarter of the unit processing interval T from the start point of the unit processing interval T, the median time position of the unit processing interval T, and the time position spaced one-quarter of the unit processing interval T from the end point of the unit processing interval T are set as mapping-source sample locations, as illustrated in FIG. 5B2, for each interpolation interval $t_i$ of the representative-point audio data, the samples indicated by the three double circles at the mapping-source sample locations of the input audio data are mapped onto a time position that is spaced one-quarter of the time length of the interpolation interval from the start point of the interpolation interval $t_i$, the median time position of the interpolation interval $t_i$, and a time position that is spaced one-quarter of the time length of the interpolation interval from the end point of the interpolation interval $t_i$ by using a mapping function $\omega_i$ for the interpolation interval $t_i$ to upsample the representative-point audio data, and the upsampled representative-point audio data is output as high-frequency interpolated audio data.

In the process of the interpolation processing unit 33 described above, if a sample of the input audio data at each mapping-source sample location is included in representative-point audio data as a sample of the representative-point audio data, the sample of the representative-point audio data may be used in place of the sample of the input audio data at the mapping-source sample location.

The high-frequency interpolated audio data output from the interpolation processing unit 33 in the way described above is output to the amplifier 4 as is or after being subjected to any other audio signal processing such as frequency characteristic adjustment processing by the digital sound processor 3, as output audio data.

Figure 7A:
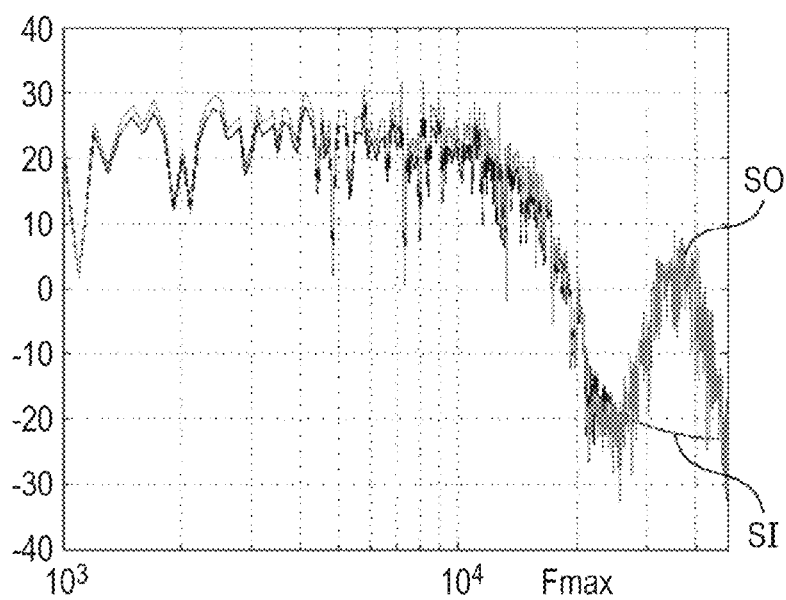
FIGS. 7A and 7B illustrate the results of high-frequency interpolation of the related art and the results of high-frequency interpolation according to forms of the present disclosure, respectively, for illustrative comparison.
Figure 7B:
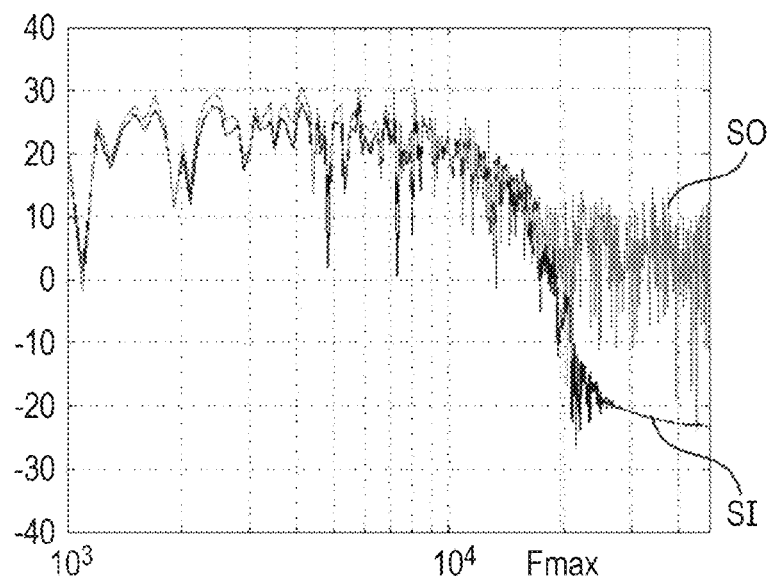

FIG. 7B illustrates the frequency characteristics of the high-frequency interpolated audio data generated in the way described above.

FIG. 7B illustrates a case where audio data has a sampling rate of 96 kHz, the upper limit of the frequency range of audio indicated by the audio data is 20 kHz, downsampled representative-point audio data has a sampling rate of 48 kHz, and high-frequency interpolated audio data has a sampling rate of 96 kHz. In FIG. 7B, SI represents a frequency characteristic of audio data and SO represents a frequency characteristic of audio data whose high-frequency components have been interpolated by using an FIF.

As demonstrated from comparison with FIG. 7A described above, in high-frequency interpolated audio data subjected to high-frequency interpolation according to forms of the present disclosure, as illustrated in FIG. 7B, high-frequency components around the upper limit Fmax of the frequency range of the audio indicated by the input audio data are also interpolated without being lost.

Therefore, embodiments and forms of the present disclosure may enable desired interpolation of high-frequency components of audio data regardless of the upper limit of the frequency range of audio indicated by the audio data.

It is therefore intended that the foregoing detailed description be regarded as illustrative rather than limiting, and that it be understood that it is the following claims, including all equivalents, that are intended to define the spirit and scope of this invention.

What is claimed is:

1. An audio processing apparatus for performing high-frequency interpolation of audio data, comprising:
 a processor configured to execute instructions and to act as:
  a frequency range upper-limit detector configured to detect an upper limit of a frequency range of audio indicated by input audio data that is audio data to be subjected to the high-frequency interpolation;
  a downsampler configured to downsample the input audio data by decimating samples from the input audio data so as to achieve a sampling rate that is less than or equal to twice the upper limit detected by the frequency range upper-limit detector to generate intermediate audio data; and an upsampler configured to upsample the intermediate audio data generated by the downsampler using a fractal interpolation function to generate high-frequency interpolated audio data;

wherein the downsampler is configured to downsample the input audio data to a maximum sampling rate equal to the sampling rate that is less than or equal to twice the upper limit detected by the frequency range upper-limit detector among sampling rates that are reciprocals of powers of 2 of the sampling rate of the input audio data, by decimating samples from the input audio data, to generate intermediate audio data, and wherein the upsampler is configured to upsample the intermediate audio data to a sampling rate that is a multiple of a power of 2 of a sampling rate of the intermediate audio data using a fractal interpolation function to generate the high-frequency interpolated audio data.

2. The audio processing apparatus according to claim 1, wherein the input audio data comprises audio data obtained by decoding compressed and encoded audio data, and wherein the frequency range upper-limit detector is configured to detect the upper limit of the frequency range of the audio indicated by the input audio data on the basis of a bit rate indicating a number of bits of the compressed and encoded audio data to be processed per unit time when the compressed and encoded audio data is reproduced.

3. An audio processing apparatus for performing high-frequency interpolation of audio data, comprising:

a processor configured to execute instructions and to act as:

a frequency range upper-limit detector configured to detect an upper limit of a frequency range of audio indicated by input audio data that is audio data to be subjected to the high-frequency interpolation;

a downsampler configured to downsample the input audio data by decimating samples from the input audio data so as to achieve a sampling rate that is less than or equal to twice the upper limit detected by the frequency range upper-limit detector to generate intermediate audio data; and an upsampler configured to upsample the intermediate audio data generated by the downsampler using a fractal interpolation function to generate high-frequency interpolated audio data wherein the input audio data comprises audio data obtained by decoding compressed and encoded audio data, and wherein the frequency range upper-limit detector is configured to detect the upper limit of the frequency range of the audio indicated by the input audio data on the basis of a bit rate indicating the number of bits of the compressed and encoded audio data to be processed per unit time when the compressed and encoded audio data is reproduced.

4. An audio processing method for an audio processing apparatus that performs audio processing, for performing high-frequency interpolation of audio data, the audio processing method comprising:

a frequency range upper-limit detection step of detecting, by the audio processing apparatus, an upper limit of a frequency range of audio indicated by input audio data that is audio data to be subjected to the high-frequency interpolation;

a downsampling step of downsampling, by the audio processing apparatus, the input audio data by decimating samples from the input audio data so as to achieve a sampling rate that is less than or equal to twice the upper limit detected in the frequency range upper-limit detection step to generate intermediate audio data; and an upsampling step of upsampling, by the audio processing apparatus, the intermediate audio data generated in the downsampling step by using a fractal interpolation function to generate high-frequency interpolated audio data;

wherein the downsampling step includes downsampling the input audio data to a maximum sampling rate equal to the sampling rate that is less than or equal to twice the upper limit detected in the frequency range upper-limit detection step among sampling rates that are reciprocals of powers of 2 of the sampling rate of the input audio data, by decimating samples from the input audio data, to generate intermediate audio data, and wherein the upsampling step includes upsampling the intermediate audio data to a sampling rate that is a multiple of a power of 2 of a sampling rate of the intermediate audio data by using a fractal interpolation function to generate the high-frequency interpolated audio data.

5. The audio processing method according to claim 4, wherein the input audio data comprises audio data obtained by decoding compressed and encoded audio data, and wherein the frequency range upper-limit detection step includes detecting the upper limit of the frequency range of the audio indicated by the input audio data on the basis of a bit rate indicating the number of bits of the compressed and encoded audio data to be processed per unit time when the compressed and encoded audio data is reproduced.

6. An audio processing method for an audio processing apparatus that performs audio processing, for performing high-frequency interpolation of audio data, the audio processing method comprising:

a frequency range upper-limit detection step of detecting, by the audio processing apparatus, an upper limit of a frequency range of audio indicated by input audio data that is audio data to be subjected to the high-frequency interpolation;

a downsampling step of downsampling, by the audio processing apparatus, the input audio data by decimating samples from the input audio data so as to achieve a sampling rate that is less than or equal to twice the upper limit detected in the frequency range upper-limit detection step to generate intermediate audio data; and an upsampling step of upsampling, by the audio processing apparatus, the intermediate audio data generated in the downsampling step by using a fractal interpolation function to generate high-frequency interpolated audio data;

wherein the input audio data comprises audio data obtained by decoding compressed and encoded audio data, and wherein the frequency range upper-limit detection step includes detecting the upper limit of the frequency range of the audio indicated by the input audio data on the basis of a bit rate indicating the number of bits of the compressed and encoded audio data to be processed per unit time when the compressed and encoded audio data is reproduced.

\* \* \* \* \*